(12) United States Patent
Thurston et al.

(10) Patent No.: US 8,179,952 B2
(45) Date of Patent: May 15, 2012

(54) PROGRAMMABLE DUTY CYCLE DISTORTION GENERATION CIRCUIT

(75) Inventors: Jason Thurston, Raleigh, NC (US); Carl Thomas Gray, Apex, NC (US)

(73) Assignee: Integrated Device Technology inc., San Jose, CA (US)

( * ) Notice: Subject to any disclaimer, the term of this patent is extended or adjusted under 35 U.S.C. 154(b) by 816 days.

(21) Appl. No.: 12/153,796

(22) Filed: May 23, 2008

(65) Prior Publication Data

US 2009/0290626 A1    Nov. 26, 2009

(51) Int. Cl.
 *H04B 3/46* (2006.01)
(52) U.S. Cl. ........ 375/224; 375/221; 375/219; 375/226; 375/227
(58) Field of Classification Search .................. 375/224, 375/221, 219, 226, 227
See application file for complete search history.

(56) References Cited

U.S. PATENT DOCUMENTS

| | | |
|---|---|---|
| 4,475,088 A | 10/1984 | Beard |
| 5,132,988 A | 7/1992 | Fisher et al. |
| 5,150,128 A | 9/1992 | Kongelbeck |
| 5,392,295 A | 2/1995 | Coker et al. |
| 5,764,655 A * | 6/1998 | Kirihata et al. ............... 714/733 |
| 6,163,867 A | 12/2000 | Miller et al. |
| 6,298,458 B1 | 10/2001 | Cranford, Jr. et al. |
| 6,694,462 B1 | 2/2004 | Reiss et al. |
| 6,809,591 B1 | 10/2004 | Ohashi |
| 7,010,069 B2 | 3/2006 | Chugg et al. |
| 7,116,953 B2 | 10/2006 | Kim et al. |
| 7,184,469 B2 * | 2/2007 | Joseph et al. ................. 375/224 |
| 7,243,272 B2 | 7/2007 | Tarango et al. |
| 7,295,604 B2 | 11/2007 | Cranford, Jr. et al. |
| 7,332,947 B2 * | 2/2008 | Kumar et al. ................. 327/150 |
| 7,352,165 B2 | 4/2008 | Loke et al. |
| 7,363,563 B1 * | 4/2008 | Hissen et al. ................. 714/733 |
| 7,405,594 B1 | 7/2008 | Xu |
| 7,408,387 B2 | 8/2008 | Suenaga |
| 7,532,053 B2 | 5/2009 | Rausch |
| 7,558,991 B2 | 7/2009 | Mattes et al. |
| 7,577,192 B2 | 8/2009 | Matis |
| 7,610,526 B2 | 10/2009 | Sherlock et al. |
| 7,667,502 B2 | 2/2010 | Agarwal |
| 7,675,363 B2 | 3/2010 | Deguchi et al. |
| 7,756,197 B1 | 7/2010 | Ferguson et al. |
| 7,777,998 B2 | 8/2010 | Stockinger et al. |
| 7,809,052 B2 * | 10/2010 | Li ................................ 375/226 |
| 7,817,387 B2 | 10/2010 | Khazhinsky et al. |
| 2002/0039052 A1 | 4/2002 | Straub et al. |
| 2003/0102928 A1 | 6/2003 | d'Haene et al. |
| 2004/0141268 A1 | 7/2004 | Miller et al. |
| 2005/0036576 A1 | 2/2005 | Agazzi et al. |
| 2005/0057872 A1 | 3/2005 | Lee et al. |
| 2005/0185351 A1 | 8/2005 | Miller et al. |
| 2005/0193290 A1 * | 9/2005 | Cho et al. ..................... 714/710 |

(Continued)

FOREIGN PATENT DOCUMENTS

WO    2007/053111    5/2007

*Primary Examiner* — Siu Lee
(74) *Attorney, Agent, or Firm* — Marger Johnson & McCollom

(57) ABSTRACT

An integrated circuit is provided comprising: a serial transmitter, a serial receiver and a serial connection providing communication between the serial transmitter and the serial receiver. The integrated circuit further comprises a duty cycle distortion circuit so that the integrated circuit can be stress tested by distorting the duty cycle of a signal within the integrated circuit.

19 Claims, 3 Drawing Sheets

U.S. PATENT DOCUMENTS

| | | |
|---|---|---|
| 2005/0245225 A1 | 11/2005 | Park et al. |
| 2006/0020865 A1 | 1/2006 | Dai et al. |
| 2006/0087328 A1* | 4/2006 | Sasajima ............... 324/713 |
| 2006/0087356 A1 | 4/2006 | Minzoni |
| 2006/0114629 A1 | 6/2006 | Wu et al. |
| 2007/0026809 A1* | 2/2007 | Zhang et al. ........... 455/67.11 |
| 2007/0053120 A1 | 3/2007 | Gauthier et al. |
| 2007/0101214 A1 | 5/2007 | Stauffer et al. |
| 2007/0121713 A1 | 5/2007 | Yamaguchi |
| 2007/0146014 A1 | 6/2007 | Cheung |
| 2007/0195875 A1 | 8/2007 | Agazzi et al. |
| 2008/0062597 A1 | 3/2008 | Chen et al. |
| 2008/0130800 A1 | 6/2008 | Maxim et al. |
| 2008/0225380 A1 | 9/2008 | Heffner et al. |
| 2008/0226306 A1 | 9/2008 | Heffner et al. |
| 2008/0237587 A1 | 10/2008 | Nierle et al. |
| 2008/0240212 A1* | 10/2008 | Satou ..................... 375/221 |
| 2008/0285358 A1 | 11/2008 | Nierle |
| 2009/0003495 A1 | 1/2009 | Wu et al. |
| 2009/0041101 A1* | 2/2009 | Nagatani ................ 375/221 |
| 2009/0116851 A1 | 5/2009 | Heffner et al. |
| 2009/0177457 A1* | 7/2009 | Dai et al. ............... 703/14 |
| 2009/0185609 A1 | 7/2009 | Takada |
| 2009/0249139 A1 | 10/2009 | Wang et al. |
| 2009/0257334 A1 | 10/2009 | Ogura et al. |
| 2009/0316767 A1 | 12/2009 | Hidaka |
| 2010/0020861 A1 | 1/2010 | Leibowitz et al. |
| 2010/0233971 A1 | 9/2010 | Vassiliou et al. |

* cited by examiner

PROGRAMMABLE DUTY CYCLE DISTORTION GENERATION CIRCUIT

BACKGROUND OF THE INVENTION

1. Field of the Invention

The present invention relates to stress testing integrated circuits. More particularly, this invention relates to stress testing integrated circuits in which serial data is communicated by altering the duty cycle of a signal within that integrated circuit.

2. Description of the Prior Art

It is known to perform tests on integrated circuits comprising serial receivers which receive serialized data from serial transmitters over high speed serial links. Such testing, for example shortly after manufacturing, involves artificially downgrading the quality of the signal sent over the serial link in order to test how well the serial receiver copes with that poor quality data and whether it can still recover the original data that was transmitted. A receiver's ability to cope with such distorted signals is referred to as its jitter tolerance.

Typically, a external programmable signal generator is used to provide the source of the variation in the serial data. The distorted signal used for testing jitter tolerance is commonly referred to as a stressed eye. Such a stressed eye may comprise variation in the duty cycle of a transmitted signal. Currently, the primary method for testing jitter tolerance is to create a stressed eye off-chip using high speed test equipment. Such equipment may, for example, create a serial data stream to be received by a serial receiver in which the duty cycle is distorted.

Such high speed test equipment is expensive and complex and hence it is desirable to provide an improved technique for testing integrated circuits.

SUMMARY OF THE INVENTION

Viewed from a first aspect, there is provided an integrated circuit comprising: a serial transmitter; a serial receiver; a serial connection providing communication between said serial transmitter and said serial receiver; and a duty cycle distortion circuit configured to distort a duty cycle of a signal within said integrated circuit so as to stress test said integrated circuit.

According to the techniques of the present invention, the creation of a stressed eye for stress testing an integrated circuit is enabled using components which are located on-chip, hence avoiding the need for costly off-chip testing equipment. A duty cycle distortion circuit distorts a duty cycle of a signal within the integrated circuit. This distortion of the duty cycle of the signal creates a stress with which the integrated circuit must cope, if it is to continue operating as it would if no distortion had been applied. The integrated circuit's ability to cope with imperfect signals is thus tested. Hence, a simpler arrangement for stress testing the integrated circuit is provided, which makes use of hardware that mostly already exists in an integrated circuit comprising a serial transmitter, serial receiver and serial connection between them. Thus, with a small amount of additional hardware a simple and easily programmable duty cycle distortion generation circuit for self-testing on-chip is provided.

The distortion of the duty cycle of the signal may be used to test various different components of the integrated circuit, but in one embodiment said duty cycle distortion circuit distorts said duty cycle to degrade said communication so as to stress test said serial receiver. By degrading the communication over the serial connection in this manner, the serial receiver's ability to cope with real-world, less-than-ideal signals being transmitted over the connection is tested.

In another embodiment said duty cycle distortion circuit distorts said duty cycle to stress test a duty cycle correction circuit. If the duty cycle of a signal exceeds the tolerances of components of the integrated circuit which receive that signal, then errors in the operation of the integrated circuit will arise. For this reason a duty cycle correction circuit may be provided to correct for departures from an ideal duty cycle, and the duty cycle distortion circuit of this technique can be used to test the performance of that duty cycle correction circuit.

In order to stress test the integrated circuit the duty cycle distortion circuit may form part of various different components of the integrated circuit. In one embodiment the duty cycle distortion circuit forms part of said serial transmitter. In another embodiment the said duty cycle distortion circuit forms part of said serial receiver. In another embodiment the duty cycle distortion circuit forms part of a clock generation circuit. In another embodiment the duty cycle distortion circuit forms part of a buffer.

In one embodiment where the duty distortion circuit forms part of a buffer, the buffer is a differential current mode logic buffer.

It will be appreciated by those skilled in this art that the duty cycle distortion circuit could operate in a variety of ways, but in one embodiment the duty cycle distortion circuit is controlled by a duty cycle distortion control circuit. This provides an advantageously simple manner for the operation of the duty cycle distortion circuit to be programmable, such that the operator can stress test the integrated circuit as fully as the application requires.

When the duty cycle distortion circuit is controlled by a duty cycle distortion control circuit, it will be recognized that there are various ways that the control can be effected, but in one embodiment the duty cycle distortion control circuit controls said duty cycle distortion circuit by voltage control. Thus, by the simple mechanism of setting a voltage level the degree of distortion applied to the duty cycle can be determined. In another embodiment the duty cycle distortion control circuit controls said duty cycle distortion circuit by a digital control signal. This represents an advantageously simple mechanism for transmitting a range of discrete control signals, depending on the particular encoding of the digital control signal.

In some embodiments where the duty cycle distortion control circuit controls said duty cycle distortion circuit by a digital control signal the duty cycle distortion circuit comprises a digital to analog converter. This enables the duty cycle correction circuit to derive an analog signal, such as a particular current on a control line with which to effect the duty cycle distortion.

It will be recognised that the particular manner in which the duty cycle distortion is applied to the signal could take a number of forms, but in one embodiment said duty cycle distortion circuit adds an offset current to said signal. By adding an offset current to the signal, the signal is shifted with respect to a given threshold, and due to the finite slew rate of the signal, an asymmetric duty cycle will result where that signal is received. Whilst the offset current could be added in a unilateral manner, in one embodiment the offset current is added differential to said signal.

According to one embodiment the communication is self-timed serial data communication. The accurate transmission and reception of this variety of communication is dependent on well timed duty cycles, and stress testing of an integrated circuit in which self-timed serial data communication occurs is advantageously carried out by distorting the duty cycle of a signal within that integrated circuit.

Viewed from a second aspect there is provided a method of stress testing an integrated circuit, comprising the steps of:

providing communication between a serial transmitter and a serial receiver on said integrated circuit over a serial connection; and distorting within said integrated circuit a duty cycle of a signal to stress test said integrated circuit.

Viewed from a third aspect there is provided a integrated circuit comprising:

a serial transmitter means for transmitting serial data;

a serial receiver means for receiving serial data;

a serial connection means for providing communication between said serial transmitter means and said serial receiver means; and a duty cycle distortion means for distorting a duty cycle of a signal within said integrated circuit to stress test said integrated circuit.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
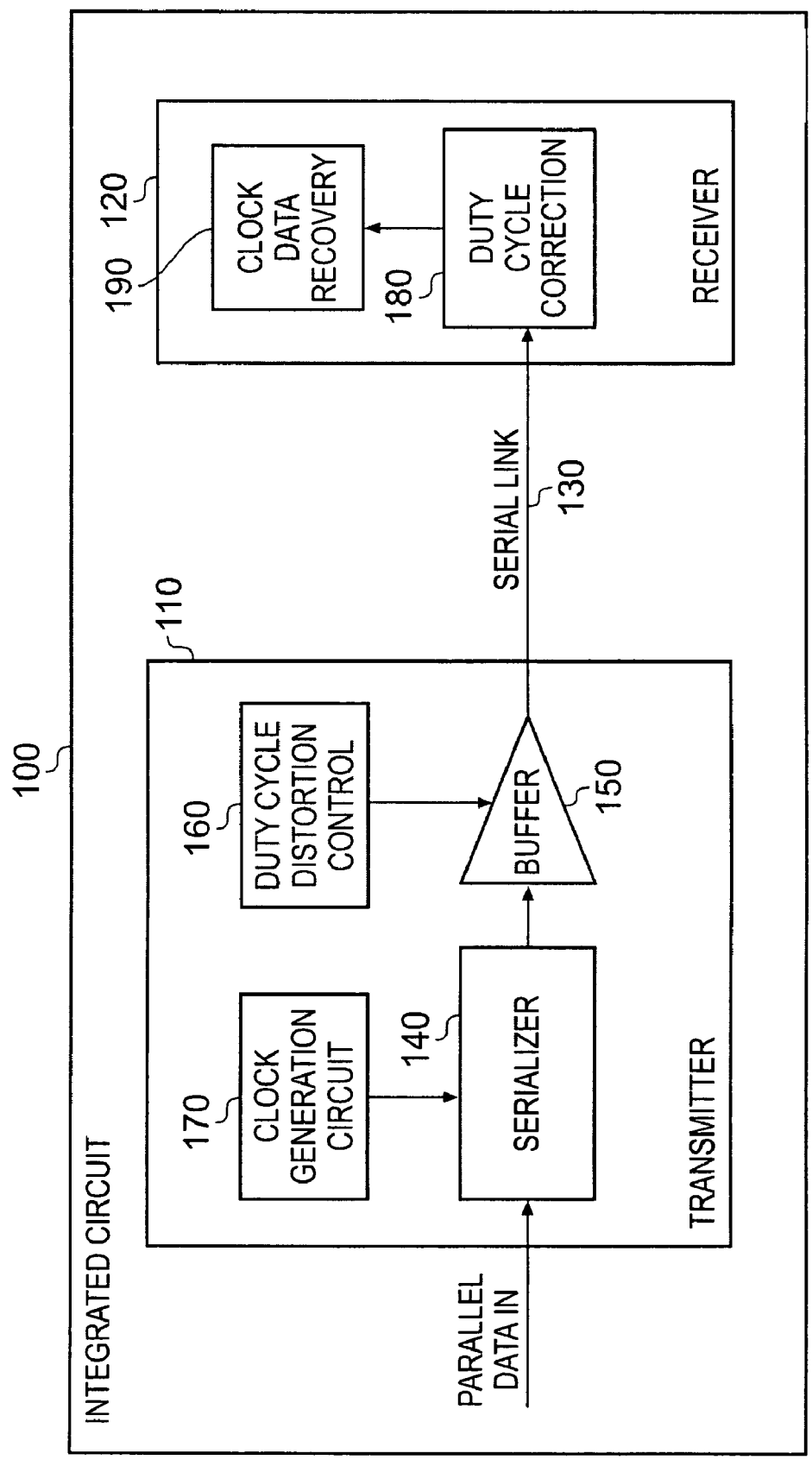
FIG. 1 schematically illustrates an integrated circuit according to one example embodiment of the present invention.

FIG. 1 schematically illustrates an integrated circuit 100, comprising a serial transmitter 110, a serial receiver 120 and a serial link 130. Serial link 130 connects serial transmitter 110 to serial receiver 120. Serial transmitter 110 receives parallel data and serializes it with serializer 140 for transmission over serial link 130. In this embodiment serializer 140 generates self-timed serial data. This is done with reference to a clock signal received from clock generation circuit 170. On the transmission path leading out of serializer 140 is a data buffer 150, through which the serialized data passes on its way to serial link 130. Also connected to data buffer 150 is duty cycle distortion control unit 160. Within data buffer 150 is a duty cycle distortion circuit configured to distort a duty cycle of the serialized data passing though the buffer. This distortion is carried out under the control of duty cycle distortion control unit 160 by means of a duty cycle control signal.

Duty cycle distortion control unit 160 is programmed to provide a number of duty cycle distortion tests by varying the distortion applied to the serialized data passing through data buffer 150. These may range from simply applying a constant duty cycle distortion, to periodically varying the duty cycle, to applying a pseudo-random pattern to the variation of the duty cycle.

The self-timed serialized data, with its duty cycle thus distorted is transmitted over serial link 130 to serial receiver 120. Serial receiver 120 comprises duty cycle correction unit 180 and clock data recovery unit 190. Duty cycle correction unit attempts to correct for any duty cycle distortions in the signals received over serial link 130 and passes the corrected signal on to clock data recovery unit 190. Clock data recovery unit attempts to unfold the clock signal encoded in the serialized data to enable the transmitted data to be sampled and recovered. Distortion in the duty cycle of the serialized data makes these tasks more difficult and varying the degree of duty cycle distortion applied at data buffer 150 enables the serial receiver to be stress tested.

In other embodiments the techniques of the present invention may be applied to stress test the integrated circuit in other ways. For example the duty cycle distortion circuit may be provided within the serial receiver instead, to apply the duty cycle distortion after the serialized data has been transmitted over the serial link 130. In another example the duty cycle distortion circuit is provided in clock generation circuit 170 to cause it to generate a clock signal for use by the serializer 140 with a distorted duty cycle.

Figure 2:
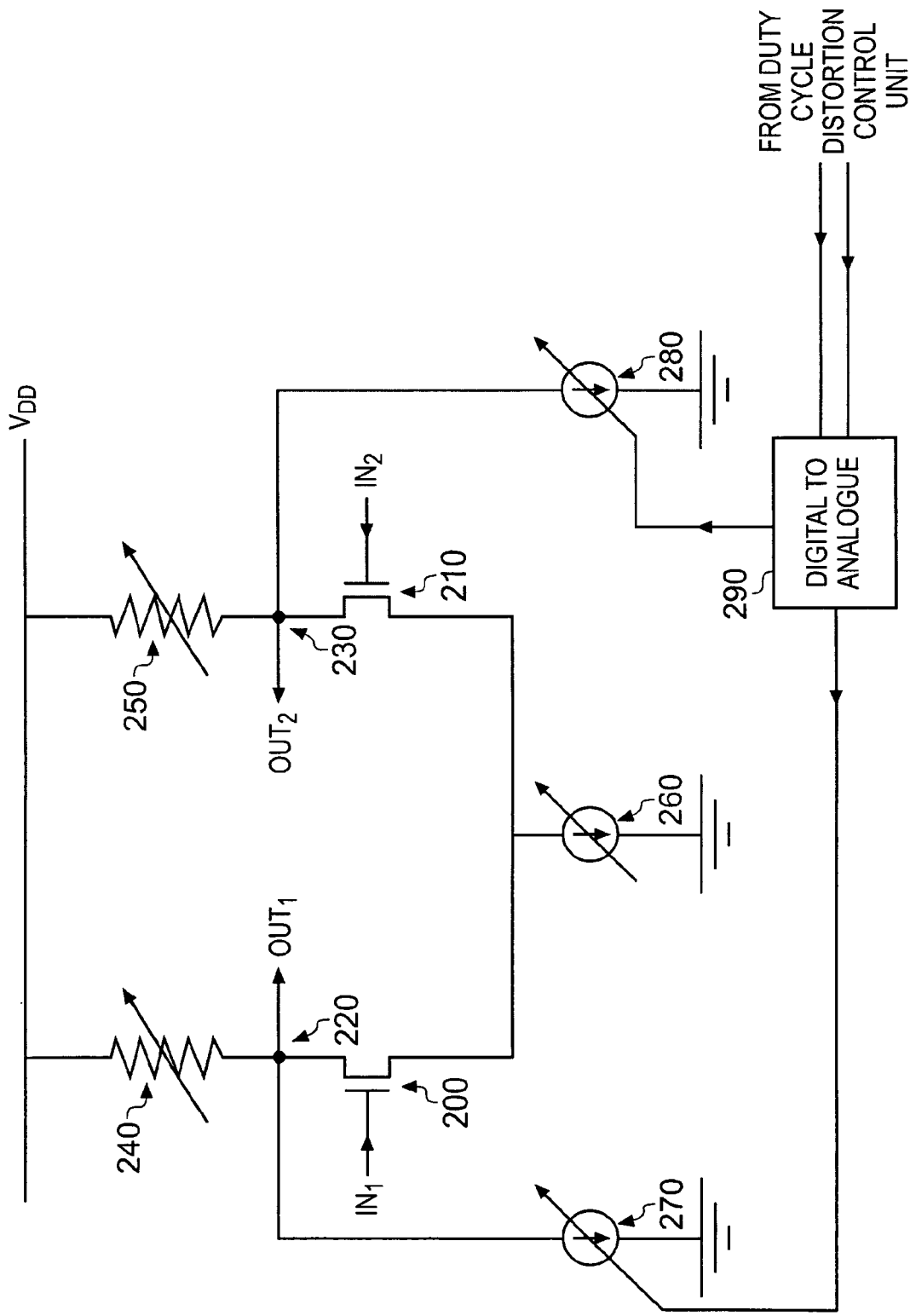
FIG. 2 schematically illustrates a differential current mode logic buffer with duty cycle distortion circuit.

FIG. 2 schematically illustrates a buffer such as data buffer 150 in FIG. 1. This differential current mode logic buffer has data inputs $IN_1$ and $IN_2$ are connected to transistors 200 and 210 respectively. Outputs $OUT_1$ and $OUT_2$ are connected to points 220 and 230 respectively. Points 220 and 230 are connected via variable resistors 240 and 250 respectively to $V_{DD}$. Both transistors 200 and 210 are each connected via variable current source 260 to ground.

When operating without duty cycle distortion being applied, the input data stream applied to inputs $IN_1$ and $IN_2$ alternately switches the left and right branches such that points 220 and 230 are alternately driven high (towards $V_{DD}$) and low (towards ground). The absolute levels of the outputs $OUT_1$ and $OUT_2$ are set via the particular setting of variable resistors 240 and 250, and of variable current source 260.

When duty cycle distortion is to be applied, this is done via variable current sources 270 and 280. By controlling the level of each of these current sources, a differential bias is applied across the points 220 and 230, and hence across $OUT_1$ and $OUT_2$. This current offset shifts the absolute level of the output and results in a duty cycle distortion of the signal passing through the buffer, as will be further explained with reference to FIG. 3. The control of variable current sources 270 and 280 comes from the duty cycle distortion control unit 160 and may in some embodiments be a voltage control. In the illustrated embodiment the duty cycle distortion control unit 160 issues a digital control signal, which passed through digital to analog converter 290 to provide the steering signal for each of the variable current sources 270 and 280.

Figure 3:
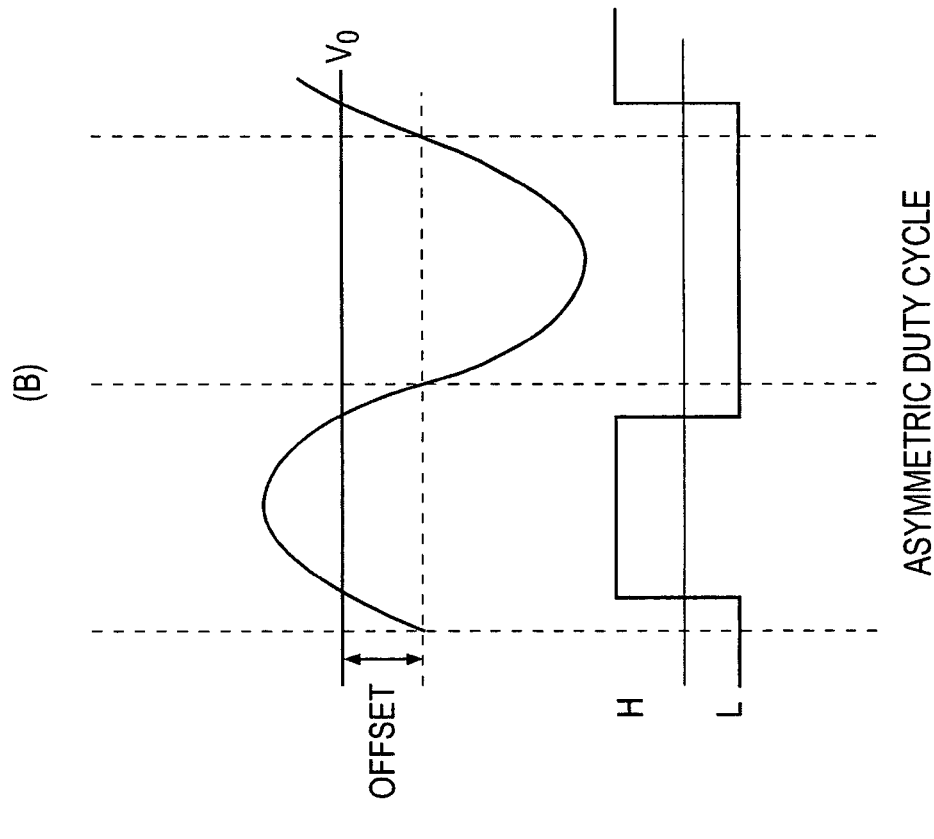
FIG. 3 schematically illustrates imposing an asymmetric duty cycle on a signal by adding an offset current.
Figure 3:
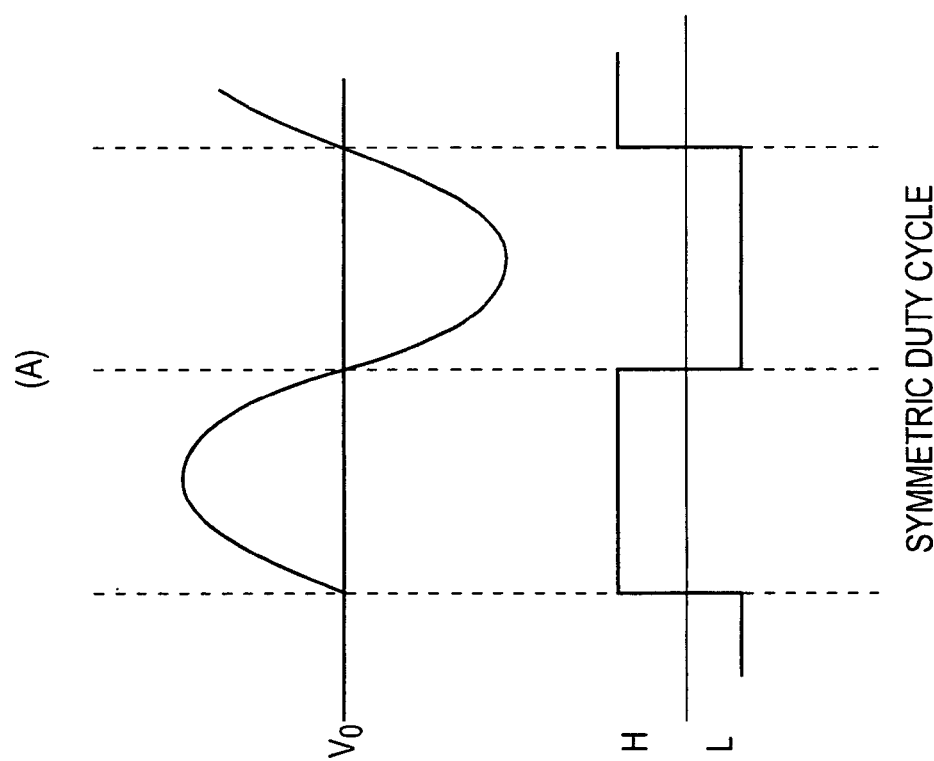

FIG. 3 schematically illustrates the distortion of a signal duty cycle by offsetting a signal. In FIG. 3A the upper waveform oscillates symmetrically around the level $V_0$, resulting in a symmetrical duty cycle (equal periods of high (H) and low (L)) as illustrated by the lower waveform. Once an offset has been applied, as illustrated in FIG. 3B, this results in an asymmetrical duty cycle (unequal periods of high (H) and low (L)). This is due to the slew rate of the upper waveform, which therefore means that it takes a finite amount of time for, say, the rising edge to cross the level $V_0$ from the illustrated starting point. Thus by varying the offset applied to the signal any chosen distorted duty cycle may be applied to the signal to stress test the components receiving that signal.

Thus, according to the present technique, a programmable duty cycle distortion generation circuit is provided, embodied on-chip, thus avoiding the need to use external off-chip testing facilities to create a stressed eye to stress test components of the integrated circuit.

Although particular embodiments of the invention have been described herein, it will be apparent that the invention is not limited thereto, and that many modifications and additions may be made within the scope of the invention. For example, various combinations of the features of the following dependent could be made with the features of the independent claims without departing from the scope of the present invention.

We claim:

1. An integrated circuit comprising:
a serial transmitter;
a serial receiver;
a serial connection providing communication between said serial transmitter and said serial receiver;
a duty cycle distortion circuit configured to distort a duty cycle of a signal within said integrated circuit by differentially adding an offset current to said signal to generate a voltage offset in the signal so as to stress test said integrated circuit; and
wherein said duty cycle distortion circuit comprises a first current source coupled between a first differential output and a ground potential and further comprises a second current source coupled between a second differential output and the ground potential, and wherein the first current source and the second current source are configured to generate the voltage offset in the signal by adding the current offset to the signal.

2. An integrated circuit as claimed in claim 1, wherein said duty cycle distortion circuit distorts said duty cycle to degrade said communication so as to stress test said serial receiver.

3. An integrated circuit as claimed in claim 1, wherein said duty cycle distortion circuit is configured to distort said duty cycle to stress test a duty cycle correction circuit.

4. An integrated circuit as claimed in claim 1, wherein said duty cycle distortion circuit forms part of said serial transmitter.

5. An integrated circuit as claimed in claim 1, wherein said duty cycle distortion circuit forms part of said serial receiver.

6. An integrated circuit as claimed in claim 1, wherein said duty cycle distortion circuit forms part of a clock generation circuit.

7. An integrated circuit as claimed in claim 1, wherein said duty cycle distortion circuit forms part of a buffer.

8. An integrated circuit as claimed in claim 7, wherein said buffer is a differential current mode logic buffer.

9. An integrated circuit as claimed in claim 1, wherein said duty cycle distortion circuit is controlled by a duty cycle distortion control circuit.

10. An integrated circuit as claimed in claim 9, wherein said duty cycle distortion control circuit is configured to control said duty cycle distortion circuit by voltage control.

11. An integrated circuit as claimed in claim 9, wherein said duty cycle distortion control circuit is configured to control said duty cycle distortion circuit by a digital control signal.

12. An integrated circuit as claimed in claim 11, wherein said duty cycle distortion circuit comprises a digital to analog converter for converting the digital control signal to an analog control signal for controlling addition of the offset current to the signal.

13. An integrated circuit as claimed in claim 1, wherein said communication is self-timed serial data communication.

14. A method of stress testing an integrated circuit, comprising:
providing communication between a serial transmitter and a serial receiver on said integrated circuit over a serial connection; and
distorting within said integrated circuit a duty cycle of a signal to stress test said integrated circuit by differentially adding an offset current to said signal to generate a voltage offset in the signal, said offset current generated by using a first current source coupled between a first differential output and a ground potential, and a second current source coupled between a second differential output and the ground potential.

15. The method of claim 14, further comprising:
receiving a digital signal; and
controlling addition of the offset current to the signal based on the digital signal.

16. The method of claim 15, wherein controlling addition of the offset current to the signal comprises:
converting the digital signal to an analog signal; and
controlling the addition of the offset current to the signal based on the analog signal.

17. An integrated circuit comprising:
a serial transmitter means for transmitting serial data;
a serial receiver for receiving serial data;
a serial connection means for providing communication between said serial transmitter means and said serial receiver; and
a duty cycle distortion circuit for distorting a duty cycle of a signal within said integrated circuit by differentially adding an offset current to said signal to generate a voltage offset in the signal to stress test said integrated circuit, said offset current generated by using a first current source coupled between a first differential output and a ground potential, and a second current source coupled between a second differential output and the ground potential.

18. The integrated circuit of claim 17, wherein the duty distortion circuit comprises:
a duty cycle distortion control circuit configured to receive a digital signal and control the duty cycle distortion circuit based on the digital signal.

19. The integrated circuit of claim 18, wherein said duty cycle distortion circuit comprises a digital to analog converter for converting the digital control signal to an analog control signal for controlling addition of the offset current to the signal.

* * * * *